US007729176B2

(12) United States Patent
Lee (10) Patent No.: US 7,729,176 B2
(45) Date of Patent: Jun. 1, 2010

(54) PROGRAM ACCELERATION OF A MEMORY DEVICE

(75) Inventor: June Lee, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 193 days.

(21) Appl. No.: 12/165,287

(22) Filed: Jun. 30, 2008

(65) Prior Publication Data
US 2009/0323430 A1    Dec. 31, 2009

(51) Int. Cl.
*G11C 16/04* (2006.01)

(52) U.S. Cl. .......................... 365/185.24; 365/185.18; 365/185.19

(58) Field of Classification Search ............ 365/185.24, 365/185.18, 185.19
See application file for complete search history.

(56) References Cited

U.S. PATENT DOCUMENTS

| 7,539,059 B2* | 5/2009 | Lee et al. ............... 365/185.21 |
| 2007/0195607 A1* | 8/2007 | Eitan et al. ............. 365/185.24 |
| 2008/0159005 A1 | 7/2008 | Lee et al. |
| 2008/0239806 A1* | 10/2008 | Moschiano et al. .... 365/185.03 |

OTHER PUBLICATIONS

Byeon, Dae-Seok et al., "An 8Gb Multi-Level NAND Flash Memory with 63nm STI CMOS Process Technology", ISSCC 2005/Session 2/Non-Volatile Memory/ 2.2, (Feb. 7, 2005), pp. 46-47.

Hara, Takahiko et al., "A 146mm2 8Gb NAND Flash Memory with 70nm CMOS Technology", ISSCC 2005/ Session 2/Non-Volatile Memory/2.1, (Feb. 7, 2005), pp. 44, 45 and 584.

Suh, Kang-Deog et al., "A 3.3 V 32 Mb NAND Flash Memory with Incremental Step Pulse Programming Scheme", IEEE Journal of Solid-State Circuits, vol. 30, No. 11, (Nov. 1995), pp. 1149-1156.

Lee, June et al., "A 90-nm CMOS 1.8-V 2-Gb NAND Flash Memory for Mass Storage Applications", IEEE Journal of Solid-State Circuits, vol. 38, No. 11, (Nov. 2003), pp. 1934-1942.

"256M×8 Bit / 128M×16 Bit NAND Flash Memory", Preliminary Flash Memory, 38 pgs., Sep. 19, 2001.

Cho, Taehee et al., "A Dual-Mode NAND Flash Memory: 1-Gb Multilevel and High-Performance 512-Mb Single-Level Modes", IEEE Journal of Solid-State Circuits, vol. 36, No. 11, (Nov. 2001), pp. 1700-1706.

* cited by examiner

*Primary Examiner*—Pho M. Luu
(74) *Attorney, Agent, or Firm*—Cool Patent, P.C.

(57) ABSTRACT

Selective program acceleration of a memory device is generally described. A method includes applying a first bias voltage to one or more bit lines coupled with a plurality of cells to be programmed, applying one or more program pulses to the plurality of cells, verifying the plurality of cells at a target threshold voltage to determine whether one or more cells of the plurality of cells have reached or surpassed the target threshold voltage, identifying slower cells of the plurality of cells, and selectively accelerating a program speed of the slower cells to reduce a programming time of a memory device.

15 Claims, 4 Drawing Sheets

PROGRAM ACCELERATION OF A MEMORY DEVICE

TECHNICAL FIELD

Embodiments of the present invention are generally directed to the field of memory and, more particularly, to programming techniques of memory devices.

BACKROUND

Generally, programming approaches for a memory device may include pulse programming to raise a threshold voltage of one or more cells of the memory device to a target threshold voltage. Such programming typically occurs during a programming time. Slow programming time may result in delay.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of selective program acceleration of a memory device are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

Figure 1:
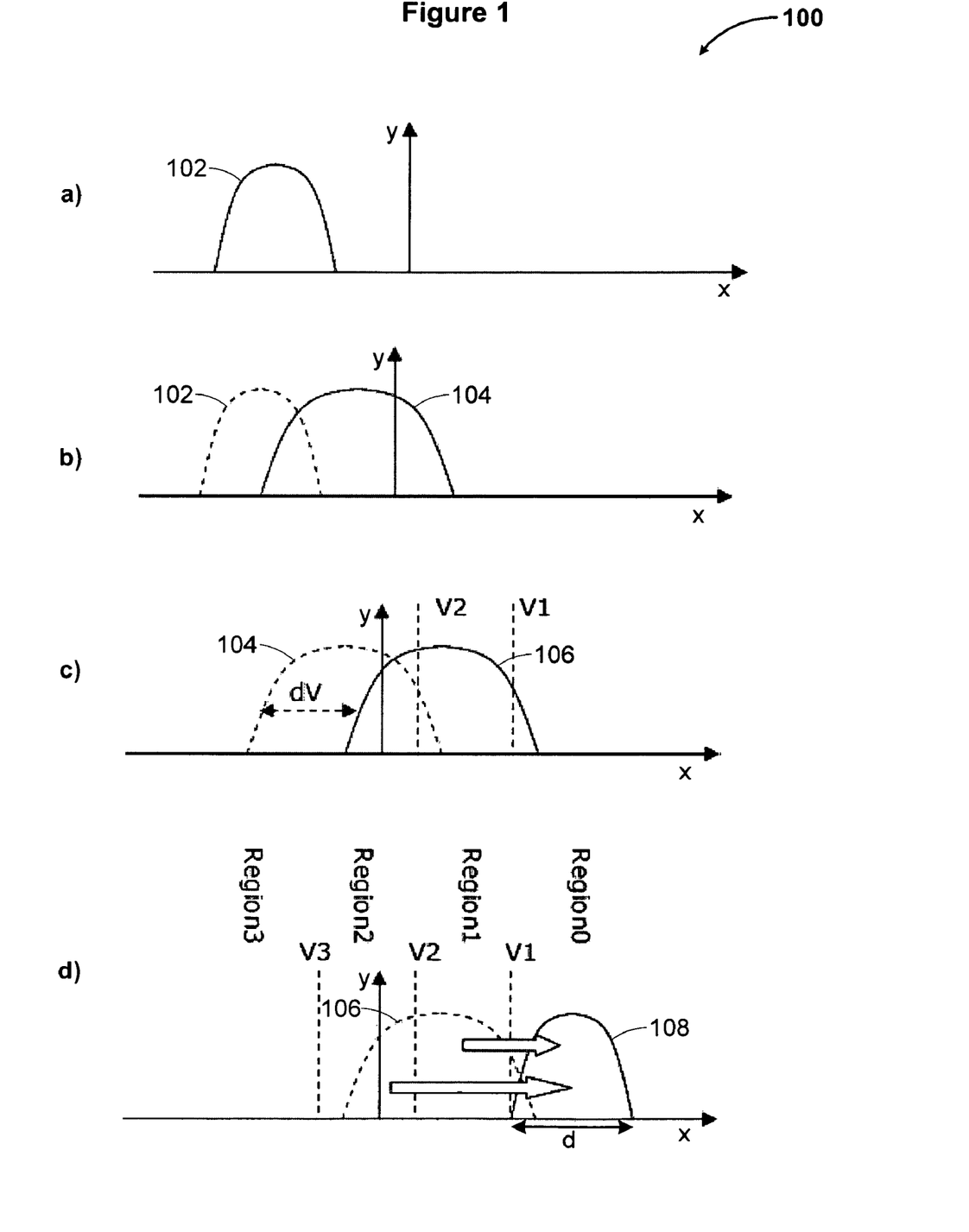
FIG. 1 is a conceptual diagram that depicts selective program acceleration of a plurality of cells of a memory device, according to but one embodiment.

FIG. 1 is a diagram that depicts selective program acceleration of a plurality of cells of a memory device, according to but one embodiment. Plurality may refer to two or more cells in an embodiment. FIG. 1 may depict selective program acceleration wherein FIG. 1a) depicts a distribution 102 of cell threshold voltages (Vt) at an initial erased state, FIG. 1b) depicts a distribution 104 of cell Vt after a first program pulse, FIG. 1c) depicts a distribution 106 of cell Vt after a second program pulse, and FIG. 1d) depicts a distribution 108 of cell Vt after a third program pulse. More or less program pulses than depicted may be used in other embodiments. Methods described herein may include identifying slower cells in a pulse program algorithm and selectively accelerating the program speed of the slower cells to reduce programming time of a memory device.

In an embodiment according to FIG. 1a), diagram 100 includes a distribution 102 of cell Vt at an erased state where x represents cell Vt, which increases in the direction indicated by the x arrow, and where y represents a number of cells at a particular cell Vt, which increases in the direction indicated by the y arrow. Cells of distribution 102 may comprise a plurality of cells to be programmed at or above a target threshold voltage (V1) shown in FIG. 1c). Cells of a memory device may have a distribution 102 of cell Vt after program or erase due to process variation in manufacturing the cells such as variation of critical dimension (CD) for cell structures or variations in floating gate coupling ratio (GCR). Distribution 102 may comprise other distributions including normal or non-normal distributions in an embodiment.

In an embodiment according to FIG. 1b), diagram 100 includes a distribution 104 of cell Vt after a first program pulse. Distribution 104 of cell Vt may comprise the same cells of distribution 102, which is depicted here with dashes to provide a point of reference for the movement of Vt in the cells of distribution 104. Distribution 104 may comprise a wider distribution than distribution 102. In an embodiment, a first program pulse comprises a program voltage (Vpgm) that is applied to the plurality of cells of distribution 102.

A bias voltage may be applied to the plurality of cells of distribution 104 while a program pulse is applied to affect program speed. Generally, a higher bias voltage results in slower program speed and lower bias voltage results in faster program speed. This principle is described further with respect to FIG. 4. In an embodiment, a first bias voltage (Vbias1) is applied to the plurality of cells of distribution 102 while a first program pulse is applied to the plurality of cells of distribution 102. First bias voltage Vbias1 may be applied to one or more bit lines coupled with the plurality of cells of distribution 102. Vbias1 may be applied to all bit lines coupled with cells to be programmed. In an embodiment, Vbias1 comprises a voltage of about 0.6 V to about 1 V. A value for Vbias1 may at least depend on a trim condition.

FIG. 1b) may depict an embodiment where all cells of FIG. 1a) are to be programmed. In other embodiments, fewer than all cells may be programmed. In an embodiment, an inhibiting voltage such as a supply voltage (Vcc) may be applied to cells of a distribution 102 that are not to be programmed.

In an embodiment according to FIG. 1c), diagram 100 includes a distribution 106 of cell Vt after a second program pulse. Distribution 106 of cell Vt may comprise the same cells of distribution 104, which is depicted here with dashes to provide a point of reference for the movement of Vt in the cells of distribution 106. In an embodiment, dV is a stepping voltage, V1 is the target threshold voltage, and V2 is a discriminating voltage to identify slower cells in the distribution 106. V2 may be referred to as discriminating because it is used to distinguish slower from faster cells with respect to program speed. The discriminating voltage V2 may be less than the target threshold voltage V1 and may be selected to distinguish one or more slower cells in the distribution 106 for a given program pulse. In an embodiment, V2 is a ground voltage. In other embodiments, V2 is a voltage between a ground voltage and a supply voltage Vcc. In one example embodiment, V1 comprises a voltage of about 0 V to about 0.2 V, V2 comprises a voltage of about 0.8 V to about 1.2 V, Vcc comprises a voltage of about 2.3 V to about 2.5 V, and ground comprises a voltage of about 0 V. Vcc may comprise a regulated internal Vcc and voltages described above may vary at least according to trim condition.

Slower cells may be identified by verifying the plurality of cells of distribution 106 at V2. Information about cell Vt may be stored in a buffer such as, for example, a page buffer. In an embodiment, cells below V2 are slower cells and cells above V2 are not slower cells. In an embodiment, the plurality of cells of a distribution 102, 104, 106 are verified at V2 after each program pulse. In another embodiment, the plurality of cells of distribution 102, 104, 106 are verified at V2 only once after it has been determined that one or more cells of the distribution 102, 104, 106 have reached V1. Verifying the cells of distribution 102, 104, 106 at V1 may be used to determine whether cell Vt has reached or surpassed V1. In an embodiment, cells of distribution 102, 104, 106 are verified at V1 after any program pulse.

Cells of distribution 106 that have reached or surpassed V1 may be suppressed or inhibited in a manner that prevents further programming of these cells during subsequent program pulses. In an embodiment, an inhibiting voltage is applied to cells that have a Vt above V1 to prevent further programming of these cells. Inhibiting voltage may be applied to the cells by applying the inhibiting voltage to bit lines coupled with the cells. The inhibiting voltage may be greater than Vbias1. In an embodiment, inhibiting voltage comprises a supply voltage Vcc. In another embodiment, inhibiting voltage comprises a voltage that is greater than or equal to a select gate drain bias voltage applied to the cell string during a program pulse.

After slower cells have been identified, a second bias voltage (Vbias2) may be applied to the slower cells below V2 to selectively accelerate their program speed relative to the other cells above V2. The other cells above V2 may continue with the applied first bias voltage Vbias1 during subsequent program pulses. In an embodiment, Vbias2 is less than Vbias1. In another embodiment, Vbias1 and Vbias2 are applied to one or more bit lines coupled with the plurality of cells of the distribution 106 during subsequent program pulses.

In an embodiment according to FIG. 1d), diagram 100 includes a distribution 108 of cell Vt after a third program pulse. Distribution 108 of cell Vt may comprise the same cells of distribution 106, which is depicted here with dashes to provide a point of reference for the movement of Vt in the cells of distribution 108. FIG. 1d) depicts a theoretical voltage, V3, which is less than V1 and V2 and also depicts various regions including Region0 above V1, Region1 between V2 and V1, Region2 between V3 and V2, and Region3 below V3.

In an embodiment, Vt of all cells in distribution 106 are moved to reach or surpass V1 by a third program pulse. The resulting distribution 108 may be a narrower distribution than distribution 106 because Region2 cells receive an applied bias Vbias2 that is less than an applied bias Vbias1 for Region1 cells. Such biasing may relatively accelerate the program speed of Region2 cells in comparison with Region1 cells. This concept of relative program speed is indicated by horizontal arrows that point to distribution 108 from Region1 and Region2.

In an embodiment, the final distribution 108 has a value, d, which is about equal to or slightly greater than a stepping voltage dV. In an embodiment, d is the maximum Vt minus the minimum Vt of the final cell distribution 108, or in other words, the highest Vt of the programmed cells minus the lowest Vt of the programmed cells. The value, d, may not include Vt from cells that failed to program or otherwise spurious results that substantially depart from expected distribution.

In an embodiment, a bias voltage of Vcc is applied to one or more cells of distribution 106 in Region0 during the third program pulse, a bias voltage of Vbias1 is applied to one or more cells of distribution 106 in Region1 during the third program pulse, and a bias voltage of Vbias2 is applied to one or more cells of distribution 106 in Region2 during the third program pulse. Vbias2 may be less than Vbias1 and Vbias1 may be less than Vcc. In an embodiment, such biasing increases the effective stepping voltage for cells having a Vt in Region2 from dV to dV+(Vbias1−Vbias2). In an embodiment, Vbias1 comprises a voltage of about 1 V, Vbias2 comprises a voltage of about 0 V, and dV comprises a voltage of about 1 V. If V1−V2 is less than dV, then the cells in Region1 may be shifted to Region0 to complete programming of such cells. If V3+dV+(Vbias1−Vbias2) is greater than V1, then the cells in Region2 may be shifted to Region0 as well to complete programming of such cells. Cells below theoretical voltage V3 may not move to Region0 by a third program pulse. In an embodiment, an additional program pulse stepped up by stepping voltage dV may be used to complete programming of such cells.

In an embodiment, techniques described herein at least allow for identification and selective acceleration of program speed of slower cells to reduce a programming time of a memory device. For example, techniques described herein may reduce program time for lower page programming of multi-level cell (MLC) NAND flash memory or single-level cell (SLC) programming. Other technologies may benefit from techniques described herein in other embodiments.

Figure 2:
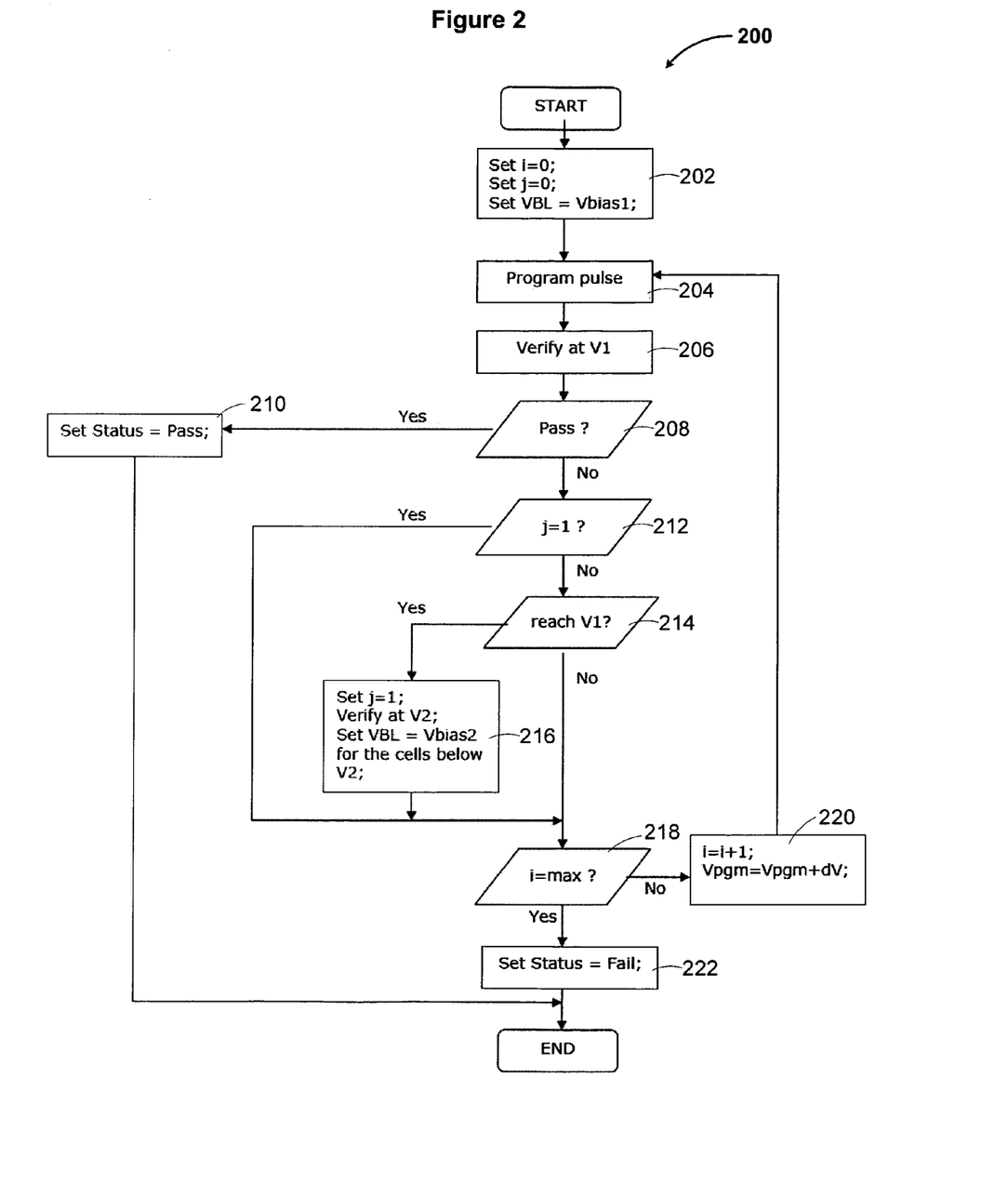
FIG. 2 is a flow diagram of a method for selective program acceleration of a memory device, according to but one embodiment.

FIG. 2 is a flow diagram of a method for selective program acceleration of a memory device, according to but one embodiment. In an embodiment, method 200 comprises setting a program pulse counter, i, and register, j, to initial values and applying a first bit line bias voltage (Vbias1) to one or more bit lines coupled with a plurality of cells to be programmed at box 202, applying one or more program pulses to the plurality of cells at box 204, verifying the plurality of cells at a target threshold voltage (V1) at box 206, determining whether the Vt of all of the cells of the plurality of cells have passed V1 (i.e., whether programming is complete) at decision box 208, setting a status to "pass" when all cells of the plurality of cells have a Vt that pass V1 at box 210, determining whether register, j, is equal to 1 at decision box 212, determining whether the Vt of any one or more cells of the plurality of cells has reached V1 at decision box 214, setting register j equal to 1, verifying the plurality of cells at a discriminating voltage (V2) to identify slower cells, and applying a second bit line bias voltage (Vbias2) to one or more bit lines coupled with the slower cells at box 216, determining whether the program pulse counter, i, has reached a maximum value at decision box 218, incrementing the program pulse counter, i, and increasing a program voltage (Vpgm) for program pulses by a stepping voltage, dV, at box 220, and setting a status equal to "fail" for one or more cells of the plurality of cells that have exceeded the max value of the program pulse counter, i, at box 222.

In an embodiment, a method 200 includes applying a first bias voltage Vbias1 to a plurality of cells to be programmed and may include setting i=0 and j=0 at 202. First bias voltage Vbias1 may be applied to one or more bit line coupled with a plurality of cells to be programmed. Vbias1 may be a voltage between a ground voltage and a supply voltage (Vcc). Method 200 may further include applying one or more program pulses to the plurality of cells at 204. A first program pulse may comprise a program voltage Vpgm and subsequent program pulses may increment the program voltage Vpgm by a stepping voltage, dV at 220.

Method 200 may include verifying the plurality of cells at a target threshold voltage V1 at box 206. Verifying at V1 206 may be performed to determine whether one or more cells of the plurality of cells have reached or surpassed V1 at 214. In an embodiment, a first program pulse is applied to the plurality of cells wherein the plurality of cells does not pass at 304 after verifying at V1. If a threshold voltage Vt of one or more cells of the plurality of cells reaches or surpasses V1 at 214 then one or more slower cells of the plurality of cells may be identified at 216.

In an embodiment, method 200 includes identifying slower cells of the plurality of cells at 216. Identifying slower cells of the plurality of cells may comprise verifying the plurality of cells at a discriminating voltage V2 216 to determine whether one or more cells of the plurality of cells have reached or surpassed the discriminating voltage V2. In an embodiment, the discriminating voltage V2 is less than the target threshold voltage V1. The slower cells may comprise one or one or more cells of the plurality of cells that have not reached or surpassed the discriminating voltage V2.

In an embodiment, identifying slower cells by verifying at V2 at 216 occurs only once. Limiting verification at V2 to one time may be accomplished by setting register, j, to 1 at 216 to bypass verification at V2 216 after subsequent program pulses 204. For example, decision box 212 may be true for subsequent program pulses 204. In another embodiment, identifying slower cells of the plurality of cells 216 occurs after at least one or more cells of the plurality of cells have reached or surpassed the target threshold voltage V1 at 214. In yet another embodiment, identifying slower cells of the plurality of cells 216 occurs after verifying at V1 206.

Method 200 may further comprise selectively accelerating a program speed of the slower cells. Selectively accelerating the program speed of the slower cells may reduce a programming time of a memory device at 216. Selectively accelerating the program speed of the slower cells may comprise applying a second bias voltage Vbias2 to the slower cells. In an embodiment, second bias voltage Vbias2 is less than a first bias voltage Vbias1. Applying a second bias voltage Vbias2 to the slower cells may be accomplished by applying Vbias2 to one or more bit lines coupled with the slower cells.

Method 200 may include further applying one or more program pulses 204 to the plurality of cells after applying Vbias1 and Vbias2 according to techniques described above. In an embodiment, applying one or more program pulses to the plurality of cells comprises applying a first program pulse comprising a first program voltage, $Vpgm_1$, wherein applying subsequent program pulses for cells that have not been identified as slower cells comprises applying a program voltage, Vpgm, according to the following relationship, where i is a program pulse counter and dV is a stepping voltage: $Vpgm_i = Vpgm_{i-1} + dV_{i-1}$ at 220.

In another embodiment, applying one or more program pulses to the plurality of cells comprises applying a first program pulse comprising a first program voltage, $Vpgm_i$, wherein applying a subsequent program pulse for cells that have been identified as slower cells comprises applying a program voltage, Vpgm, according to the following relationship, where i is a program pulse counter, dV is a stepping voltage, Vbias1 is a bias voltage applied to cells that have not been identified as slower cells, and Vbias2 is a bias voltage applied to cells that have been identified as slower cells: $Vpgm_i = Vpgm_{i-1} + dV_{i-1} + (Vbias1 - Vbias2)$ at 220. The term $dV_{i-1} + (Vbias1 - Vbias2)$ may represent an effective stepping voltage that results for the applied bias scheme of Vbias1 and Vbias2 described herein.

Applying one or more program pulses to the plurality of cells 204 and verifying the plurality of cells at the target threshold voltage V1 206 may repeat until all individual cell threshold voltages of the plurality of cells reach or surpass the target threshold voltage V1 208, 210 or fail 222, or combinations thereof. In an embodiment, method 200 further comprises applying a voltage to one or more cells of the plurality of cells that have reached or surpassed the target threshold voltage V1 to inhibit further programming of the one or more cells of the plurality of cells that have reached or surpassed the target threshold voltage V1 206. In an embodiment, a supply voltage Vcc is applied to one or more cells of the plurality of cells that have reached or surpassed the target threshold voltage V1 to inhibit further programming of such cells.

In an embodiment, a final distribution of Vt for the individual cells of the plurality of cells comprises a max-min value that is about equal to or slightly greater than a stepping voltage, dV. Max-min value may be a highest Vt of the plurality of cells minus a lowest Vt of the plurality of cells. The max-min value may not include Vt from cells that failed 222 to program or otherwise spurious results that substantially depart from expected distribution. In an embodiment, methods and techniques described herein are implemented by modifying macro instruction read-only memory (ROM) code for a memory device.

Figure 3:
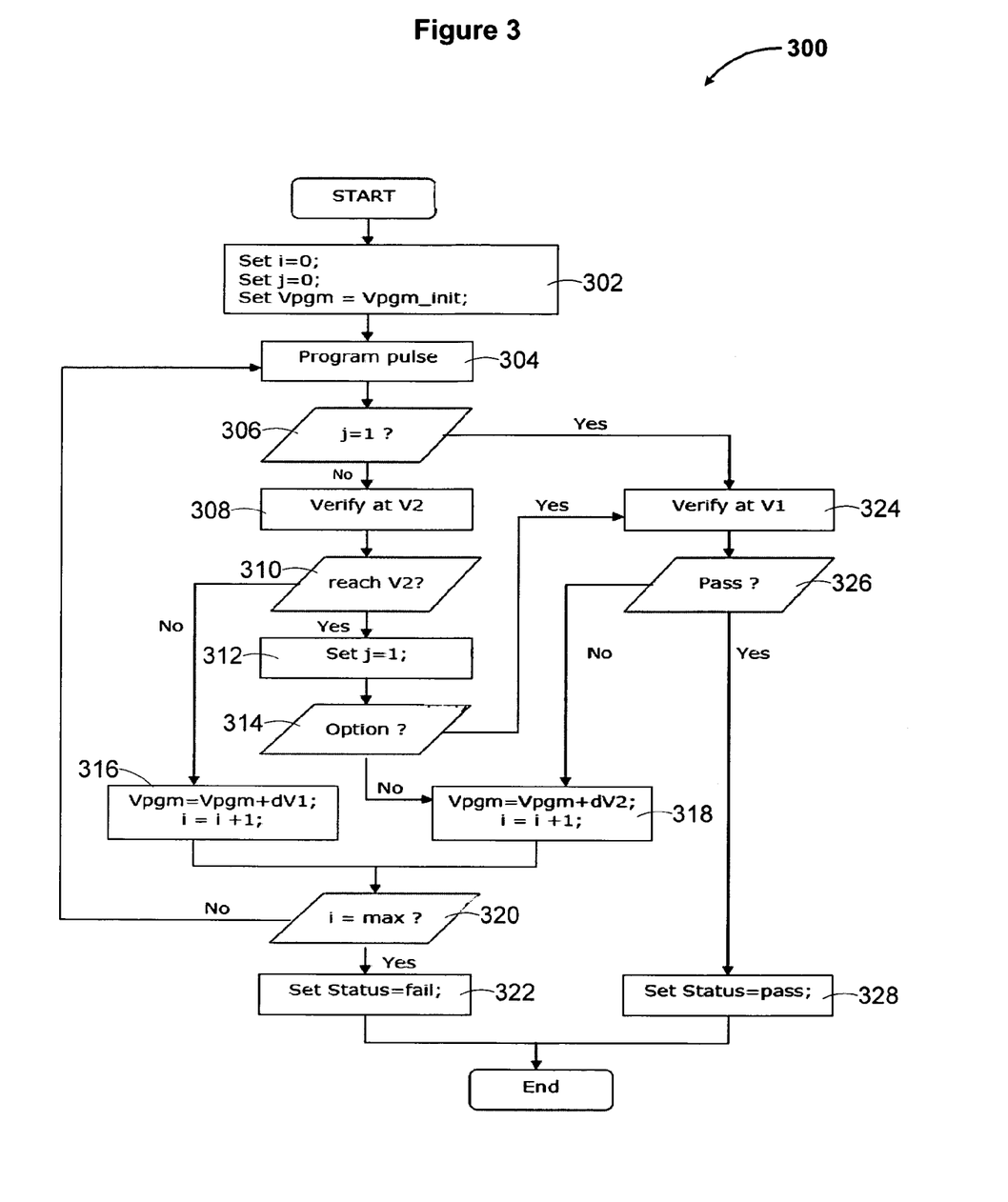
FIG. 3 is a flow diagram of another method for program acceleration of a memory device, according to but one embodiment.

FIG. 3 is a flow diagram of another method for program acceleration of a memory device, according to but one embodiment. In an embodiment, method 300 includes setting a program pulse counter, i, and register, j, to initial values and a program voltage (Vpgm) to an initial program voltage (Vpgm_init) at box 302, applying at least a first program pulse to a plurality of cells to be programmed at box 304, determining whether register, j, is equal to 1 at decision box 306, verifying the plurality of cells at a discriminating voltage, V2, at box 308 to determine whether a threshold voltage of one or more cells of the plurality of cells has reached or surpassed V2 at decision box 310, setting register, j, equal to 1 at box 312, optional decision box 314, increasing a program voltage Vpgm for a subsequent program pulse by a stepping voltage, dV1, and incrementing program pulse counter, i, by 1 at box 316, increasing a program voltage Vpgm for a subsequent program pulse by a stepping voltage, dV2, and incrementing program pulse counter, i, by 1 at box 318, determining whether the program pulse counter, i, has reached a maximum value at decision box 320, setting a status equal to "fail" for one or more cells of the plurality of cells that have exceeded a max value of i at box 322, verifying the plurality of cells at a target threshold voltage (V1) at box 324 to determine whether cell threshold voltages (Vt) of the plurality of cells have reached or surpassed the target threshold voltage V1 at box 326, and setting a status equal to "pass" at box 328 when all individual cell threshold voltages Vt of the plurality of cells reach or surpass the target threshold voltage V1.

Method 300 may provide an alternative technique to reduce programming time of a memory device by reducing the number of program pulses in a programming method. Method 300 may be combined with method 200 in an embodiment. Method 300 may generally include applying a relatively larger initial stepping voltage, dV1, 316 to cells to be programmed to increase program speed. Initial stepping voltage, dV1, may be applied 316 to cells to be programmed until one or more cells reach V2 at 310 whereupon a smaller stepping voltage, dV2, is applied 318 to the cells to be programmed to provide a tighter distribution of cell threshold voltages of the cells in a final programmed distribution above V1.

In an embodiment, method 300 comprises setting an initial program voltage Vpgm to an initial program voltage at 302. Due to program-erase cycling that may cause cell degradation, a lower program voltage Vpgm may be initially selected. In an embodiment, method 300 includes applying at least a first program pulse 304 to a plurality of cells to be programmed at or above a target threshold voltage V1.

Method 300 may further include verifying at a discriminating voltage (V2) 308 to determine whether one or more cells of the plurality of cells have reached or surpassed the discriminating voltage V2. Discriminating voltage V2 may be less than the target threshold voltage V1. In an embodiment, the discriminating voltage V2 is set to a voltage between a ground voltage and supply voltage (Vcc). In another embodiment, verifying the plurality of cells at the discriminating voltage V2 308 occurs prior to verifying at the target threshold V1 voltage at box 324.

If one or more cells of the plurality of cells have not reached or surpassed the discriminating voltage V2 at 310, then a first stepping voltage, dV1, may be applied 316 to the one or more cells. First stepping voltage, dV1, may be applied 316 to the one or more cells by incrementing a program voltage Vpgm by the first stepping voltage for application at a subsequent program pulse 304. If one or more cells of the plurality of cells have reached or surpassed the discriminating voltage V2 310, then a second stepping voltage, dV2, that is less than the first stepping voltage, dV1, may be applied 318 to the one or more cells. Second stepping voltage, dV2, may be applied 318 to the one or more cells by incrementing a program voltage Vpgm by the second stepping voltage for application at a subsequent program pulse 304.

Applying a first stepping voltage, dV1, 316 to the one or more cells when the one or more cells have not reached or surpassed the discriminating voltage V2 may increase the program speed of a memory device by reducing a number of program pulses to program the plurality of cells. Applying a second stepping voltage, dV2, 318 to the one or more cells when the one or more cells have reached or surpassed the discriminating voltage V2 may provide a tighter distribution of threshold voltages of the plurality of cells that are programmed 328 above the target threshold voltage V1 compared with only applying a first stepping voltage, dV1, 316 for every program pulse 304.

Various voltages may be used for first stepping voltage, dV1, 316 second stepping voltage, dV2, 318, target threshold voltage V1 324, and/or discriminating voltage V2 308. In an embodiment, the first stepping voltage, dV1, 316 comprises a voltage of about 1.5 V to about 2 V, the second stepping voltage, dV2, comprises a voltage of about 0.8 V to about 1.2 V, the target threshold voltage V1 comprises a voltage of about 0.8 V to about 1.2 V, and the discriminating voltage V2 comprises a value of about 0 V to about 0.4 V.

Method 300 may further include verifying the plurality of cells at the target threshold voltage V1 324 to determine whether one or more cells of the plurality of cells have reached or surpassed the target threshold voltage V1. In an embodiment, verifying the plurality of cells at the target threshold voltage V1 324 occurs after verifying the plurality of cells at the discriminating voltage V2 308.

In an embodiment, method 300 includes applying one or more program pulses 304 to the plurality of cells after applying the first program pulse 304. Applying one or more program pulses to the plurality of cells 304 and verifying the plurality of cells at the target threshold voltage V1 324 may repeat as indicated until all individual cell threshold voltages of the plurality of cells reach or surpass the target threshold voltage V1 324, 326, 328 or fail 322, or combinations thereof.

Verifying the plurality of cells at the discriminating voltage V2 308 may occur after applying one or more program pulses 304 until the one or more cells of the plurality of cells have reached or surpassed the discriminating voltage V2. For example, register j may be set equal to 1 at 312 when one or more cells of the plurality of cells have reached or surpassed the discriminating voltage V2 310. Subsequently, box 306 becomes true and verification at V2 308 is bypassed thereafter.

In an embodiment, method 300 includes an optional decision box 314, which provides a path to verify the plurality of cells at a target threshold voltage V1 324 prior to a subsequent program pulse 304 to determine whether one or more cells of the plurality of cells have reached or surpassed the target threshold voltage V1 324 and to allow for inhibition of further programming of cells that have reached or surpassed V1. A voltage such as a supply voltage Vcc may be applied to one or more cells of the plurality of cells that have reached or surpassed the target threshold voltage V1 324 to inhibit further programming of the one or more cells of the plurality of cells that have reached or surpassed the target threshold voltage V1. In other embodiments, optional decision box 314 is omitted entirely from method 300 allowing a direct path of flow from box 312 to box 318.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

An apparatus that executes the above-specified methods 200, 300 is also described. The apparatus includes a machine-readable storage medium having executable instructions that enable the machine to perform the actions in the specified process. An article of manufacture is also described; the article of manufacture includes a storage medium having instructions stored thereon that, if executed, result in the actions of method 200, 300 or actions associated with FIGS. 1-3.

Figure 4:
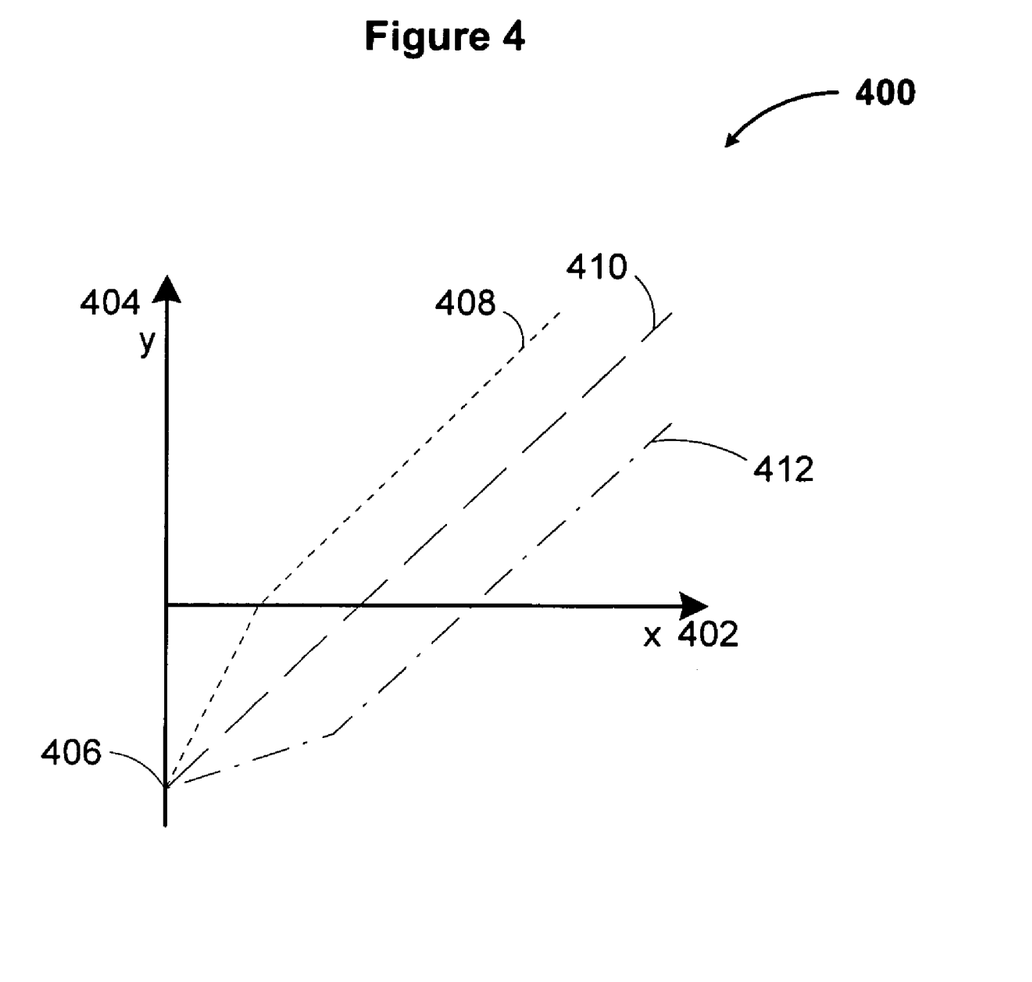
FIG. 4 is a graph depicting a principle used in selective program acceleration of a memory device, according to but one embodiment.

FIG. 4 is a graph of a principle used in selective program acceleration of a memory device, according to but one embodiment. In an embodiment, graph 400 includes an x-axis 402 representing a number of program pulses with stepping, a y-axis 404 representing cell threshold voltage (Vt), initial erase threshold voltage (Vt) 406, a first programming path 408 for a cell having a first bias, a second programming path 410 for a cell having a second bias, and a third programming path 412 for a cell having a third bias. In an embodiment, first bias is less than the second bias and the second bias is less than the third bias.

In principle, program speed may be accelerated depending on a bias voltage applied to the cell during application of a program pulse. Generally, a higher bias voltage decreases the programming speed while a lower bias voltage increases the programming speed. In an embodiment, programming path 408 is for a cell having a first bias of about 0 V, programming path 410 is for a cell having a second bias of about 0.5 V, and programming path 412 is for a cell having a third bias of about 1 V.

An electric field across a tunnel oxide of a memory device may be greater for a lower bias voltage. For example, an electric field across a tunnel oxide of a cell that follows path 408 is greater than for cells that follow paths 410 or 412. As a result, the threshold voltage for a cell that follows path 408 is greater than for paths 410 or 412 for a given number of program pulses. A bias voltage may be applied to the cell by applying a bias voltage to a bit line coupled with the cell.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method comprising:
    applying a first bias voltage to one or more bit lines coupled with a plurality of cells to be programmed;
    applying one or more program pulses to the plurality of cells;
    verifying the plurality of cells at a target threshold voltage to determine whether one or more cells of the plurality of cells have reached or surpassed the target threshold voltage;
    identifying slower cells of the plurality of cells; and
    selectively accelerating a program speed of the slower cells to reduce a programming time of a memory device.

2. A method according to claim 1 wherein identifying slower cells of the plurality of cells comprises:
    verifying the plurality of cells at a discriminating voltage to determine whether one or more cells of the plurality of cells have reached or surpassed the discriminating voltage wherein the discriminating voltage is less than the target threshold voltage and wherein the slower cells comprise one or more cells of the plurality of cells that have not reached or surpassed the discriminating voltage.

3. A method according to claim 2 wherein selectively accelerating the program speed of the slower cells comprises applying a second bias voltage to one or more bit lines coupled with the slower cells wherein the second bias voltage is less than the first bias voltage.

4. A method according to claim 1 further comprising:
    applying a voltage to one or more cells of the plurality of cells that have reached or surpassed the target threshold voltage to inhibit further programming of the one or more cells of the plurality of cells that have reached or surpassed the target threshold voltage.

5. A method according to claim 1 wherein identifying slower cells of the plurality of cells occurs only once and occurs after at least one or more cells of the plurality of cells have reached or surpassed the target threshold voltage.

6. A method according to claim 1 wherein applying one or more program pulses to the plurality of cells comprises:
    applying a first program pulse comprising a first program voltage, $Vpgm_1$, wherein applying subsequent program pulses for cells that have not been identified as slower cells comprises applying a program voltage, Vpgm, according to the following relationship, where i is a program pulse counter and dV is a stepping voltage:

$$Vpgm_i = Vpgm_{i-1} + dV_{i-1}.$$

7. A method according to claim 1 wherein applying one or more program pulses to the plurality of cells comprises:
    applying a first program pulse comprising a first program voltage, $Vpgm_1$, wherein applying a subsequent program pulse for cells that have been identified as slower cells comprises applying a program voltage, Vpgm, according to the following relationship, where i is a program pulse counter, dV is a stepping voltage, Vbias1 is a bias voltage applied to cells that have not been identified as slower cells, and Vbias2 is a bias voltage applied to cells that have been identified as slower cells:

$$Vpgm_i = Vpgm_{i-1} + di_{n-1} + (Vbias1 - Vbias2).$$

8. A method according to claim 1 wherein the actions of applying one or more program pulses to the plurality of cells and verifying the plurality of cells at the target threshold voltage repeat until all individual cell threshold voltages of the plurality of cells reach or surpass the target threshold voltage or fail, or combinations thereof, wherein a value of the highest programmed individual cell threshold voltage minus a value of the lowest programmed individual cell threshold voltage is about equal to a stepping voltage, dV, used in applying the one or more program pulses to the plurality of cells.

9. A method comprising:
    applying at least a first program pulse to a plurality of cells to be programmed at or above a target threshold voltage;
    verifying the plurality of cells at a discriminating voltage less than the target threshold voltage to determine whether one or more cells of the plurality of cells have reached or surpassed the discriminating voltage;
    applying a first stepping voltage, dV1, to the one or more cells when the one or more cells have not reached or surpassed the discriminating voltage; and
    applying a second stepping voltage, dV2, to the one or more cells when the one or more cells have reached or surpassed the discriminating voltage wherein dV1 is greater than dV2.

10. A method according to claim 9 wherein applying a first stepping voltage, dV1, to the one or more cells when the one or more cells have not reached or surpassed the discriminating voltage increases the program speed of a memory device by reducing a number of program pulses to program the plurality of cells.

11. A method according to claim 9 wherein applying a second stepping voltage, dV2, to the one or more cells when the one or more cells have reached or surpassed the discriminating voltage provides a tighter distribution of threshold voltages of the plurality of cells that are programmed above the target threshold voltage.

12. A method according to claim 9 wherein the first stepping voltage, dV1, comprises a voltage of about 1.5 V to about 2 V, the second stepping voltage, dV2, comprises a voltage of about 0.8 V to about 1.2 V, the target threshold voltage comprises a voltage of about 0.8 V to about 1.2 V, and the discriminating voltage comprises a voltage of about 0 V to about 0.4 V.

13. A method according to claim 9 further comprising:

verifying the plurality of cells at the target threshold voltage to determine whether one or more cells of the plurality of cells have reached or surpassed the target threshold voltage wherein verifying the plurality of cells at the target threshold voltage occurs after verifying the plurality of cells at the discriminating voltage.

14. A method according to claim 13 further comprising:

applying one or more program pulses to the plurality of cells after applying the first program pulse wherein the actions of applying one or more program pulses to the plurality of cells and verifying the plurality of cells at the target threshold voltage repeat until all individual cell threshold voltages of the plurality of cells reach or surpass the target threshold voltage or fail, or combinations thereof.

15. A method according to claim 14 wherein verifying the plurality of cells at the discriminating voltage occurs after applying one or more program pulses until the one or more cells of the plurality of cells have reached or surpassed the discriminating voltage.

\* \* \* \* \*